United States Patent
Shin et al.

(10) Patent No.: US 9,251,755 B2
(45) Date of Patent: Feb. 2, 2016

(54) GATE DRIVER AND LIQUID CRYSTAL DISPLAY INCLUDING THE SAME

(71) Applicant: SAMSUNG DISPLAY CO., LTD., Yongin (KR)

(72) Inventors: Ok-Kwon Shin, Asan-si (KR); Jong Min Lee, Suwon-si (KR); Sun Kyu Son, Suwon-si (KR); Young-Il Ban, Hwaseong-si (KR); Jae-Han Lee, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/470,511

(22) Filed: Aug. 27, 2014

(65) Prior Publication Data
US 2014/0368482 A1    Dec. 18, 2014

Related U.S. Application Data

(62) Division of application No. 13/238,661, filed on Sep. 21, 2011, now Pat. No. 8,912,995.

(30) Foreign Application Priority Data

May 17, 2011    (KR) .................. 10-2011-0046355

(51) Int. Cl.
*G09G 5/00* (2006.01)
*G09G 3/36* (2006.01)
*G11C 19/28* (2006.01)

(52) U.S. Cl.
CPC ............. *G09G 3/3674* (2013.01); *G09G 3/3677* (2013.01); *G11C 19/28* (2013.01); *G11C 19/287* (2013.01); *G09G 2310/0205* (2013.01); *G09G 2310/0286* (2013.01); *G09G 2310/08* (2013.01)

(58) Field of Classification Search
CPC ............. G09G 3/3648; G09G 3/3677; G09G 2310/0213; G09G 2310/0286; G09G 3/3674; G09G 2310/0205; G09G 2310/08
See application file for complete search history.

(56) References Cited

U.S. PATENT DOCUMENTS

| 7,019,497 B2 | 3/2006 | Umminger et al. |
| 2005/0253794 A1* | 11/2005 | Lee et al. ................ 345/87 |
| 2006/0038767 A1 | 2/2006 | Nakamura et al. |

(Continued)

FOREIGN PATENT DOCUMENTS

| CN | 101939777 | 1/2011 |
| JP | 07146668 | 6/1995 |

(Continued)

OTHER PUBLICATIONS

Extended European Search Report for application No. 11182664.0-2205 dated Jun. 11, 2012.

*Primary Examiner* — Lixi C Simpson
(74) *Attorney, Agent, or Firm* — Cantor Colburn LLP

(57) ABSTRACT

A gate driver includes a gate integrated circuit ("IC") chip which receives at least two scanning start signals and at least four clock control signals, and outputs a plurality of gate-on voltages, where at least two clock control signals of the at least four clock control signals are generated based on one scanning start signal of the at least two scanning start signals, timings of the at least two scanning start signals are independent of each other, and timings of the at least two clock control signals based on the one scanning start signal are independent of each other.

12 Claims, 13 Drawing Sheets

(56) References Cited

U.S. PATENT DOCUMENTS

| | | | |
|---|---|---|---|
| 2009/0174646 A1 | 7/2009 | Lim | |
| 2010/0321372 A1 | 12/2010 | Iwamoto et al. | |
| 2011/0102389 A1 | 5/2011 | Park et al. | |
| 2011/0210955 A1 | 9/2011 | Chang et al. | |
| 2011/0216098 A1* | 9/2011 | Choi et al. | 345/690 |

FOREIGN PATENT DOCUMENTS

| | | |
|---|---|---|
| JP | 11027606 | 1/1999 |
| JP | 2002244610 | 8/2002 |
| JP | 2006058638 | 3/2006 |
| JP | 3798269 | 4/2006 |
| JP | 2006285141 | 10/2006 |
| JP | 2007114476 | 5/2007 |
| JP | 2008276263 | 11/2008 |
| JP | 2010044348 | 2/2010 |
| KR | 100431626 | 5/2004 |
| KR | 1020080018648 | 2/2008 |
| KR | 1020080041908 | 5/2008 |
| KR | 100857378 | 9/2008 |

* cited by examiner

GATE DRIVER AND LIQUID CRYSTAL DISPLAY INCLUDING THE SAME

This application is a divisional of U.S. patent application Ser. No. 12/238,661 filed on Sep. 21, 2011, which claims priority to Korean Patent Application No. 10-2011-0046355 filed on May 17, 2011, and all the benefits accruing therefrom under 35 U.S.C. §119, the content of which in its entirety is herein incorporated by reference.

BACKGROUND OF THE INVENTION (a) Field of the Invention

Exemplary embodiments of a gate driver and a liquid crystal display including the gate driver are provided.

(b) Description of the Related Art

Display devices typically include multiple pairs of electric field generating electrodes and an electro-optical active layer interposed therebetween. The display devices may include a liquid crystal display ("LCD"), an organic light emitting device ("OLED") display, and an electrophoretic display. The liquid crystal display includes a liquid crystal layer as an electro-optical active layer and the organic light emitting display includes an organic light emitting layer as an electro-optical active layer. In the display devices, one of a pair of electric field generating electrodes is generally connected to a switching element to receive an electric signal, and the electro-optical active layer converts the electric signal into an optical signal to display an image.

The display device generally includes a gate driver and a data driver. The gate driver applies a gate signal that turns on or off a pixel to a gate line, and the data driver converts image data into a data voltage and applies the data voltage to a data line.

BRIEF SUMMARY OF THE INVENTION

An exemplary embodiment according to the invention provides a liquid crystal display with a slim bezel.

An exemplary embodiment according to the invention provides a gate driver that effectively controls gate-on timing.

An exemplary embodiment according to the invention provides a gate driver that effectively controls a discharging timing.

An exemplary embodiment according to the invention provides a stereoscopic image display device.

In an exemplary embodiment, a gate driver includes a gate integrated circuit ("IC") chip which receives at least two scanning start signals and at least four clock control signals, and outputs a plurality of gate-on voltages, where at least two clock control signals of the at least four clock control signals are generated based on one scanning start signal of the at least two scanning start signals, timings of the at least two scanning start signals are independent of each other, and timings of the at least two clock control signals based on the one scanning start signal are independent of each other.

In an exemplary embodiment, each of the at least two clock control signals may have a rising edge in a period when the one scanning start signal is in a high level.

In an exemplary embodiment, the plurality of gate-on voltages may be synchronized with the at least two clock control signals based on the one scanning start signal.

In an exemplary embodiment, the plurality of gate-on voltages may overlap each other.

In an exemplary embodiment, at least two scanning start signals may include a first scanning start signal and a second scanning start signal, the at least four clock control signals may include a first clock control signal, a second clock control signal, a third clock control signal and a fourth clock control signal, and the gate IC chip may include a first shift register which receives the first scanning start signal and the first clock control signal, a second shift register which receives the first scanning start signal and the second clock control signal, a third shift register which receives the second scanning start signal and the third clock control signal, and a fourth shift register which receives the second scanning start signal and the fourth clock control signal.

In an exemplary embodiment, the first clock control signal and the second clock control signal may be generated based on the first scanning start signal, and the third clock control signal and the fourth clock control signal may be generated based on the second scanning start signal.

In an exemplary embodiment, each of the first clock control signal and the second clock control signal may have a rising edge in a period when the first scanning start signal is in a high level, and each of the third clock control signal and the fourth clock control signal may have a rising edge in a period when the second scanning start signal is a high level.

In an exemplary embodiment, the plurality of gate-on voltage may include a first gate-on voltage, a second gate-on voltage, a third gate-on voltage, and a fourth gate-on voltage which are input, respectively, to sequentially positioned four gate lines. The first gate-on voltage may be synchronized with the first clock control signal, the second gate-on voltage may be synchronized with the third clock control signal, the third gate-on voltage may be synchronized with the second clock control signal, and the fourth gate-on voltage may be synchronized with the fourth clock control signal.

In an exemplary embodiment, the gate IC chip may include a shift register which receives the one scanning start signal of the at least two scanning start signals and one clock control signal of the at least two clock control signals based on the one scanning start signal, a level shifter, and a buffer which outputs a gate-on voltage of the plurality of gate-on voltages.

In an exemplary embodiment, the gate IC chip may further include an AND gate.

In an exemplary embodiment, a liquid crystal display includes: a first switching element connected to a first gate line and a first data line; a second switching element connected to the first gate line and the first data line; a first subpixel electrode connected to the first switching element; a second subpixel electrode connected to the second switching element; a third switching element connected to the second subpixel electrode and a first charge sharing line; a transformation capacitor connected to the third switching element; and a gate IC chip which receives at least two scanning start signals and at least four clock control signals, and outputs a plurality of gate-on voltages, where at least two clock control signals of the at least four clock control signals are generated based on one scanning start signal of the at least two scanning start signals, timings of the at least two scanning start signals are independent of each other, and timings of the at least two clock control signals based on the one scanning start signal are independent of each other.

In an exemplary embodiment, a first gate-on voltage of the plurality of gate-on voltages may be applied to the first gate line and synchronized with a first clock control signal of the at least two clock control signals based on the one scanning start signal, and a second gate-on voltage of the plurality of gate-on voltages may be applied to the first charge sharing line and synchronized with a second clock control signal of the at least two clock control signals based on the one scanning start signal.

In an exemplary embodiment, a rising edge of the first clock control signal may be generated in a period when a first scanning start signal of the at least two scanning start signals is in a high level, and a rising edge of the second clock control signal may be generated in a period when a second scanning start signal of the at least two scanning start signals is in a high level.

In an exemplary embodiment, a third gate-on voltage of the plurality of gate-on voltages may be applied to a second gate line adjacent to the first gate line, a timing of rising edge of the third gate-on voltage may be different from a timing of rising edge of the first gate-on voltage, a fourth gate-on voltage of the plurality of gate-on voltages may be applied to a second charge sharing line adjacent to the first charge sharing line, and a timing of rising edge of a fourth gate-on voltage may be different from a timing of rising edge of the second gate-on voltage.

In an exemplary embodiment, the subpixel electrode may be disposed outside of an area between a second data line adjacent to the first data line and a third data line adjacent to the second data line.

In an exemplary embodiment, a third gate-on voltage of the plurality of gate-on voltages may be applied to a second gate line adjacent to the first gate line, the third gate-on voltage and the first gate-on voltage may be simultaneously applied, a fourth gate-on voltage of the plurality of gate-on voltages may be applied to a second charge sharing line adjacent to the first charge sharing line, and the fourth gate-on voltage and the second gate-on voltage may be simultaneously applied.

In an exemplary embodiment, a first gate-on voltage of the plurality of gate-on voltages may be applied to the first gate line, a third gate-on voltage of the plurality of gate-on voltages may be applied to a second gate line adjacent to the first gate line, and the first gate-on voltage and the second gate-on voltage may overlap each other.

In an exemplary embodiment, the liquid crystal display may further include a bezel having a width less than about 10 millimeters.

In an exemplary embodiment, the liquid crystal display may output a three-dimensional image comprising a left eye image and a right eye image.

In an exemplary embodiment, a first gate-on voltage of the plurality of gate-on voltages may be applied to the first gate line and synchronized with the first clock control signal of the at least two clock control signals based on the one scanning start signal, and a second gate-on voltage of the plurality of gate-on voltages may be applied to the first charge sharing line and synchronized with a second clock control signal of the at least two clock control signals based on the one scanning start signal.

In an exemplary embodiment, a third gate-on voltage of the plurality of gate-on voltages may be applied to a second gate line adjacent to the first gate line, the third gate-on voltage and the first gate-on voltage may be simultaneously applied, a fourth gate-on voltage of the plurality of gate-on voltages may be applied to a second charge sharing line adjacent to the first charge sharing line, and the fourth gate-on voltage and the second gate-on voltage may be simultaneously applied.

Exemplary embodiments of the invention provide a liquid crystal display with a slim bezel which controls a discharging timing and a gate-on timing, and a stereoscopic image display device.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION OF THE INVENTION

Figure 1:
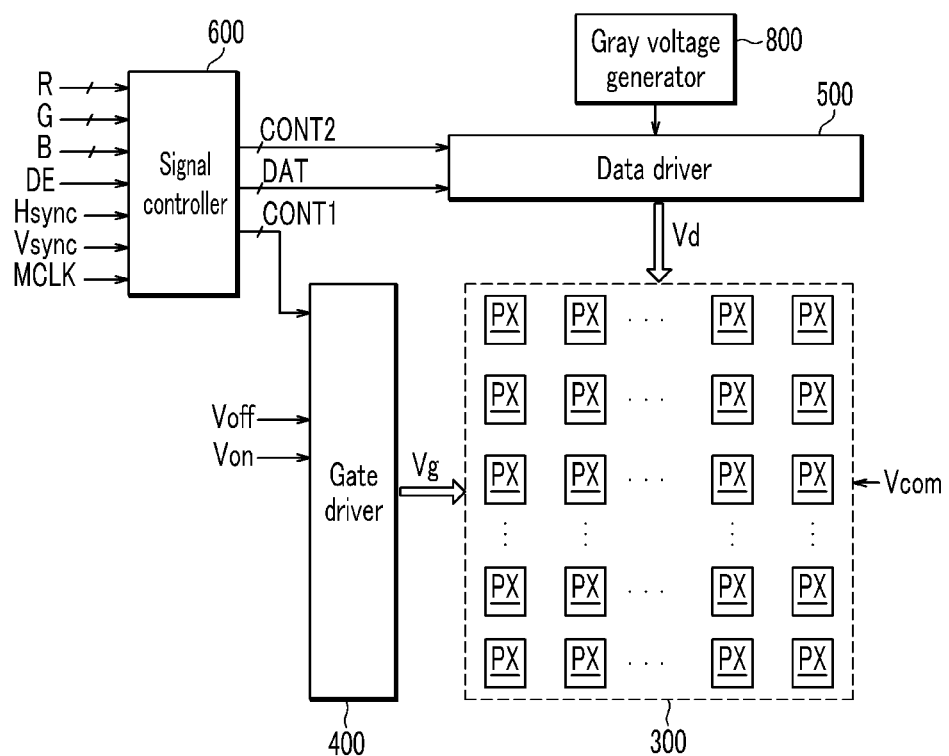
FIG. 1 is a block diagram showing an exemplary embodiment of a display device according to the invention.

The invention will be described more fully with reference to the accompanying drawings, in which exemplary embodiments of the invention are shown. As those skilled in the art would realize, the described embodiments may be modified in various different ways, all without departing from the spirit or scope of the invention. The drawings and description are to be regarded as illustrative in nature and not restrictive. Like reference numerals designate like elements throughout the specification. Further, detailed description of well-known techniques is omitted.

In the drawings, the thickness of layers, films, panels, regions, etc., are exaggerated for clarity. Like reference numerals designate like elements throughout the specification. As used herein, connected may refer to elements being physically and/or electrically connected to each other. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 2:
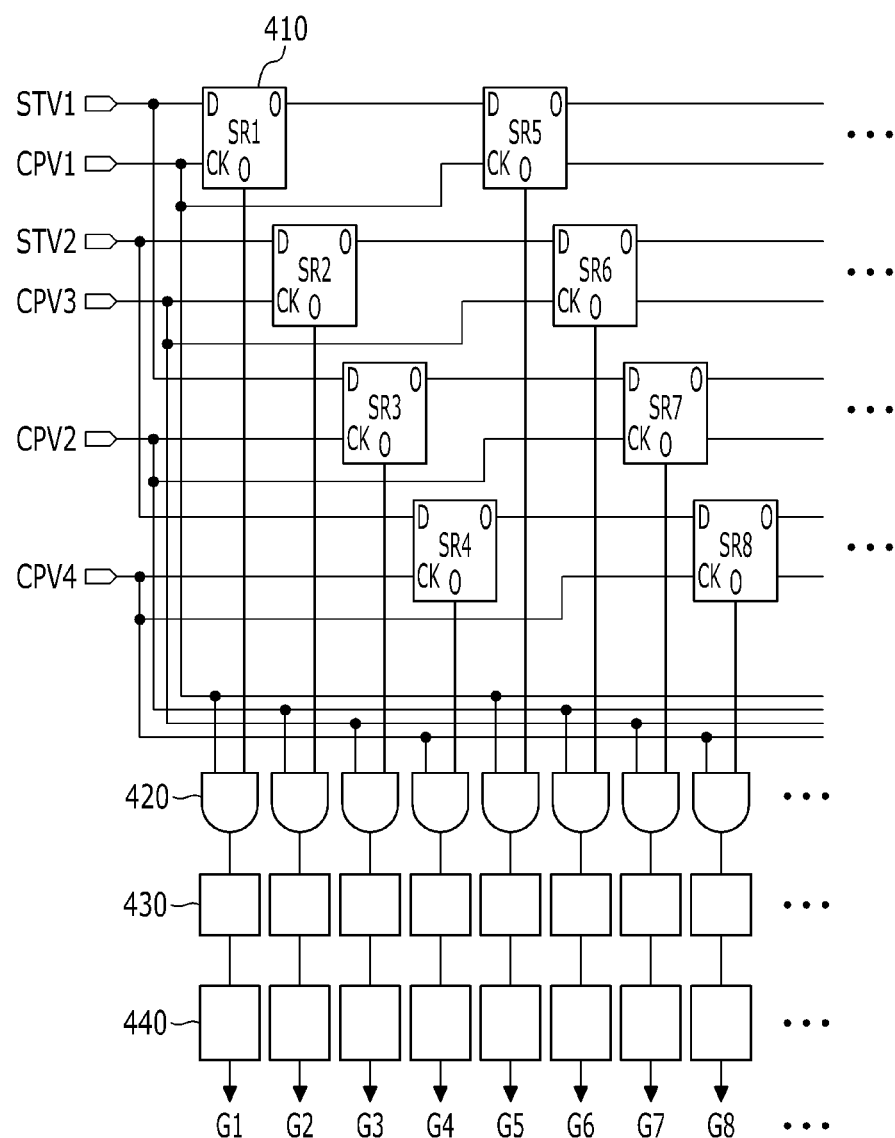
FIG. 2 is a block diagram showing an exemplary embodiment of a gate driver according to the invention.
Figure 3:
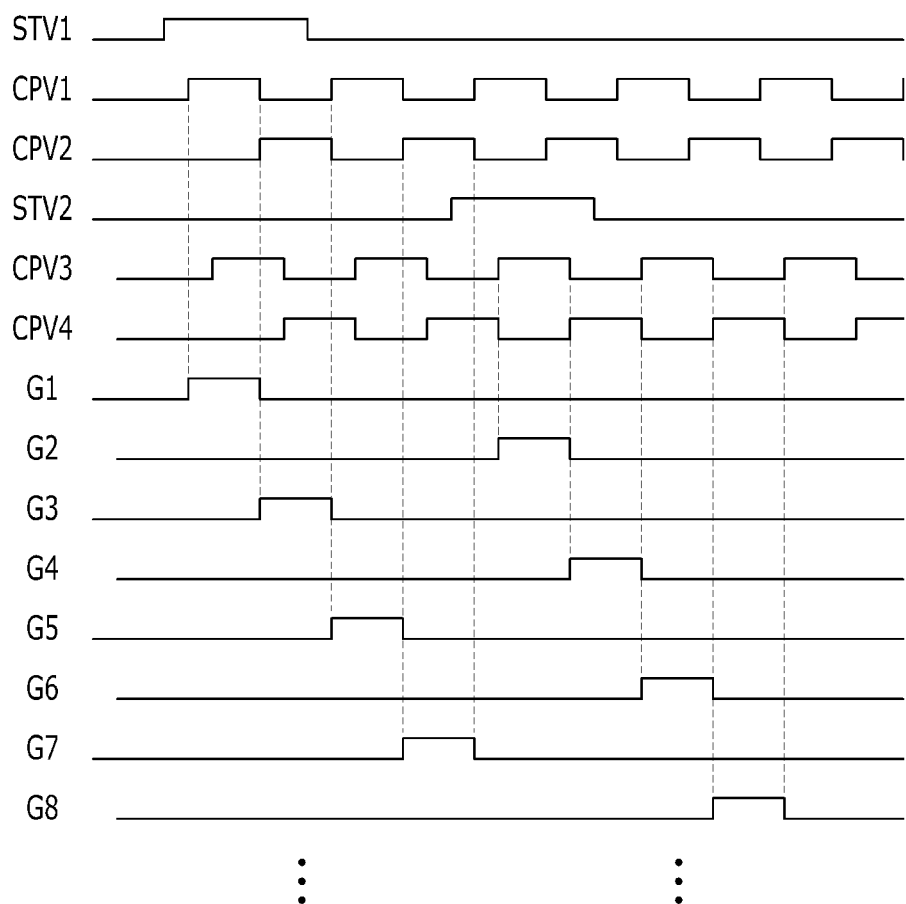
FIG. 3 is a signal timing diagram showing signals of an exemplary embodiment of a gate driver according to the invention.
Figure 4:
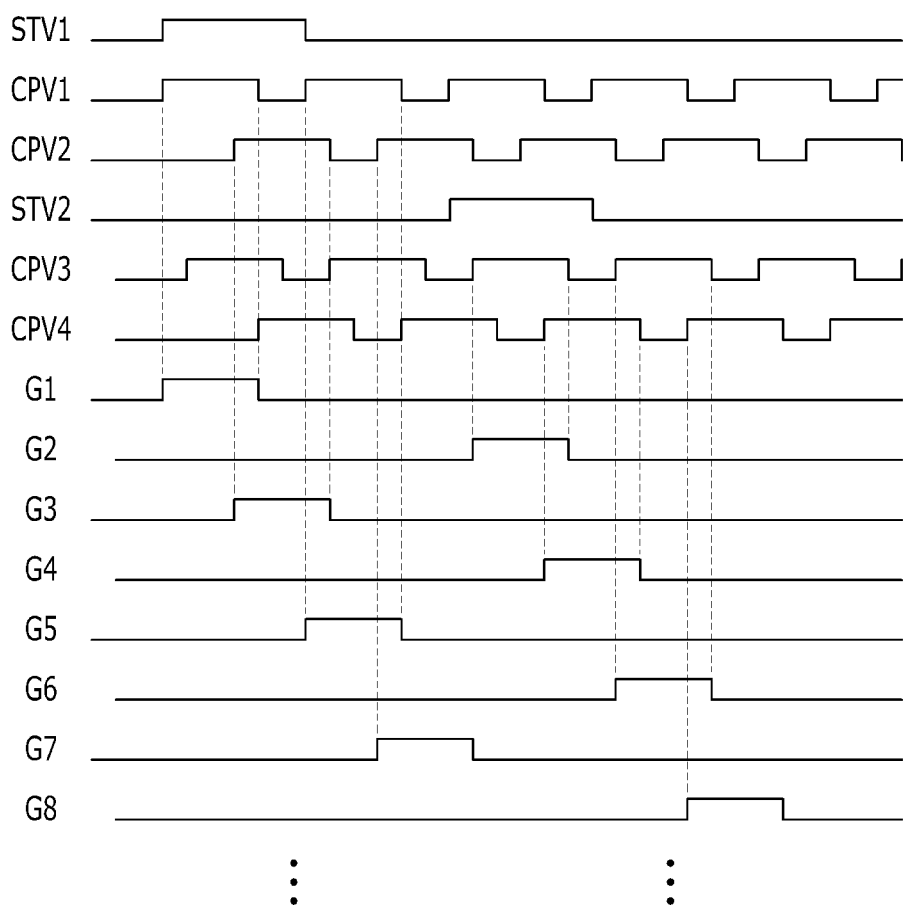
FIG. 4 is a signal timing diagram showing signals of an exemplary embodiment of a gate driver according to the invention.

FIG. 1 is a block diagram showing an exemplary embodiment of a display device according to the invention, FIG. 2 is a block diagram of a gate driver according to an exemplary embodiment of the invention, FIG. 3 is a view of a signal waveform of a gate driver according to an exemplary embodiment of the invention, and FIG. 4 is a view of a signal waveform of a gate driver according to an exemplary embodiment of the invention.

Referring to FIG. 1, a display device includes a display panel assembly 300, a gate driver 400 and a data driver 500 that are connected to the display panel assembly 300, a gray voltage generator 800 connected to the data driver 500, and a signal controller 600 that controls the gate driver 400 and the data driver 500.

In an exemplary embodiment, the display panel assembly 300 may be a liquid crystal panel assembly, an organic light emitting panel assembly or a plasma display panel assembly, for example, but not being limited thereto. The display panel assembly 300 may be various other types of displays. Hereinafter, an exemplary embodiment where the display panel assembly 300 is a liquid crystal panel assembly will now be described, however the invention is not limited thereto.

A gate-on signal Vg may be transmitted from a gate line at the upper side of the display device and may be sequentially applied to the gate line at the lower side. In one exemplary embodiment, for example, the display device may display the images as follows. The gate-on voltage Von is sequentially applied to the gate line such that a data voltage Vd is applied to a pixel electrode through a switching element connected to the corresponding gate line. In such an embodiment, the applied data voltage Vd is a data voltage to display images, and the applied data voltage Vd may be maintained for a predetermined time by a storage capacitor. The gate line is applied with the gate-off voltage Voff such that the switching element connected to the corresponding gate line may be turned off.

In a view of an equivalent circuit, the display panel assembly 300 includes a plurality of signal lines G1 to Gn and D1 to Dm and a plurality of pixels PX connected thereto.

The signal lines G1 to Gn and D1 to Dm include a plurality of gate lines G1 to Gn that transmits a gate signal and a plurality of data lines D1 to Dm that transmits a data signal.

Each pixel PX, for example, the pixel PX connected to an i-th gate line G1 (i=1, 2, ..., n) and the j-th data line Dj (j=1, 2, ..., m) includes a switching element connected to the corresponding signal lines, e.g., the i-th gate line G1 and the j-th data line Dj, and a liquid crystal capacitor connected thereto. In an exemplary embodiment, the pixel PX may selectively include a storage capacitor. Each pixel PX may include a plurality of subpixels. The switching element as a three terminal element includes a control terminal connected to the i-th gate line G1, an input terminal connected to the j-th data line Dj, and an output terminal connected to the liquid crystal capacitor and the storage capacitor. The connection of the pixel PX, the signal lines G1 and Dj, and the switching element may be variously changed. In an exemplary embodiment, one pixel may be connected to one data line and one data line. In an alternative exemplary embodiment, two pixels may share one gate line. In another alternative exemplary embodiment, two pixels may share one data line.

The liquid crystal capacitor has a pixel electrode (not shown) and a common electrode (not shown) as two terminals, and a liquid crystal layer disposed therebetween (not shown) functions as a dielectric material.

In an exemplary embodiment, the storage capacitor that serves as an auxiliary to the liquid crystal capacitor is provided by overlapping a separate signal line (not shown) other than a gate line and a date line and a pixel electrode with an insulator interposed therebetween, and a predetermined voltage, e.g., a common voltage Vcom, is applied to the separate signal line. In an alternative exemplary embodiment, the storage capacitor may be provided by a pixel electrode and a previous gate line that are arranged to overlap each other via an insulator.

In an exemplary embodiment, where a color image is displayed, each pixel PX uniquely displays one of primary colors (i.e., spatial division) or each pixel PX sequentially displays the primary colors in turn (i.e., temporal division), such that a spatial or temporal sum of the primary colors is recognized as a desired color. In one exemplary embodiment, for example, the primary colors include red, green and blue.

The signal controller 600 receives input image signals R, G and B and input control signals for controlling the display of the input image signals R, G and B such as a vertical synchronization signal Vsync, a horizontal synchronization signal Hsync, a main clock signal MCLK and a data enable signal DE from an external graphics controller (not shown).

The input image signals R, G and B may be a two-dimensional ("2D") image or a three-dimensional ("3D") image. Here, the 2D image means normal source data with which a viewer may not recognize a stereoscopic effect for the image output from the display device. The 3D image means source data with which a viewer may recognize a stereoscopic effect for the image output from the display device, for example, a left eye image and a right eye image.

The signal controller 600 may provide a data control signal CONT2 and image data DAT to the data driver 500. In an exemplary embodiment, the image data DAT may be obtained by processing image signals R, G and B according to operational conditions of the display panel assembly 300 based on an input control signal and the input image signals R, G and B. In such an embodiment, the processing of the image signals R, G and B may include an operational rearrangement of the image data R, G and B based on the pixel arrangement of the display panel assembly 300.

The signal controller 600 may provide at least one gate control signal CONT1 to the gate driver 400. In one exemplary embodiment, for example, the gate control signal CONT1 may include at least one of scanning start signals STV1 and STV2 that command the gate driver 400 to start a scan and at least one of clock control signals CPV1 to CPV4 that controls an output time of the gate-on voltage Von. In an exemplary embodiment, the gate control signal CONT1 may include at least one clock enable signal limiting an enduring time of the gate-on voltage Von, and at least one clock signal.

The data control signal CONT2 may include a horizontal synchronization start signal that informs start of transmission of data corresponding to a group of pixels, a load signal that commands the data driver 500 to apply a corresponding data voltage to the data lines D1 to Dm, and a data clock signal. The data control signal CONT2 may further include an inversion signal for inverting the polarity of the data voltage with respect to the common voltage Vcom (hereinafter, referred to as a polarity of a data voltage).

In an exemplary embodiment, the data driver 500 may receive a set of image data DAT on pixels of one row and select a gray scale voltage corresponding to each image data DAT from among gray scale voltages from a gray scale voltage generator 800 based on the data control signal CONT2. The data driver 500 may convert the image data DAT into a data voltage Vd and apply the data voltage Vd to corresponding data lines D1 to Dm.

The gate driver 400 applies the gate voltage Vg by the signal controller 600, and the gate voltage Vg is the gate-on voltage Von or the gate-off voltage Voff. When the gate-on voltage Von is applied to the gate lines G1 to Gn, the switching element connected to the gate lines G1 to Gn is turned on, and the data voltage Vd applied to the data lines D1 to Dm is applied to the corresponding pixel through the turned-on switching element.

The difference between the data voltage Vd applied to the pixel and the common voltage Vcom is referred to as a pixel voltage. In one exemplary embodiment, for example, where the display device is a liquid crystal display, liquid crystal molecules have an orientation depending on the magnitude of the pixel voltage, and accordingly, polarization of light penetrating the liquid crystal layer varies. Such variation of the polarization appears as a variation in transmittance of light due to a polarizer attached to the display panel.

In an exemplary embodiment, each of the elements of the display device, e.g., the gate driver 400, the data driver 500, the signal controller 600 and the gray voltage generator 800, may be directly mounted in at least one integrated circuit ("IC") chip provided on the liquid crystal panel assembly 300. In an alternative exemplary embodiment, each of the elements of the display device 400, 500, 600 and 800 may be mounted on a flexible printed circuit film (not shown) and then attached to the liquid crystal panel assembly 300. In another alternative exemplary embodiment, each of the elements of the display device 400, 500, 600 and 800 may be mounted on a separate printed circuit board ("PCB") (not shown) in a tape carrier package ("TCP") form. In an alternative exemplary embodiment, each of the elements of the display device 400, 500, 600 and 800 may be integrated as a single chip. In such an embodiment, at least one of the elements of the display device 400, 500, 600 and 800 or at least one circuit element constituting the elements of the display device 400, 500, 600 and 800 may be disposed outside the single chip.

Referring to FIG. 2, an exemplary embodiment of the gate driver 400 may include at least one shift register 410, at least one AND gate 420, at least one level shifter 430, and at least one buffer 440. In an exemplary embodiment, the shift register 410 may include an AND gate 420. The gate driver 400 includes at least one IC chip in which a plurality of circuit elements are realized, and the gate IC chip allows reducing the size of the gate driver, compared with a display device in which the gate driver is integrated in the display panel assembly, such that the gate driver 400 may be applied to a display device with a slim bezel having a narrow width. In one exemplary embodiment, for example, a width of the slim bezel of the display device including the gate IC chip may be less than about 10 millimeters (mm), while a width of a bezel of the display device in which the gate driver is integrated to the display panel assembly is typically greater than about 10 mm. Here, the bezel means an upper chassis and a lower chassis that enclose and fix the display panel assembly.

The shift register 410 is turned on based on the scanning start signals STV1 and STV2 and the clock control signals CPV1 to CPV4 from the signal controller 600, and outputs signals. A pulse characteristic such as a pulse width of the signal output from the shift register 410 may be controlled.

In an exemplary embodiment where the gate driver 410 includes a plurality of shift registers, the plurality of shift registers 410 are independently driven based on two scanning start signals, and two clock control signals are independently generated based on one scanning start signal. In one exemplary embodiment, as shown in FIG. 2, a (2n−1)-th shift registers SR1, SR3, SR5 and SR7 are driven based on a first scanning start signal STV1, and a 2n-th shift registers SR2, SR4, SR6 and SR8 are driven based on a second scanning start signal STV2 (n is a natural number). The timings of two scanning start signals, e.g., the timings of rising edges of the two scanning start signals, may be independent of each other, and the timing of the gate-on voltage Von may be effectively controlled based on a predetermined driving method. In such an embodiment, timings of two clock control signals based on the one scanning start signal may be independent of each other, and timings of the gate-on voltages Von may be effectively controlled to overlap each other such that display quality of the display device is substantially improved due to increased charging time. In such an embodiment, the plurality of shift registers 410 may receive three or more scanning start signals that are independently driven, and three or more clock control signals may be generated independently based on one scanning start signal. In an exemplary embodiment, the shift register 410 may include at least two pairs of an input terminal and an output terminal for the scanning start signal.

The clock control signals CPV1 to CPV4 and the output signal from the shift register 410 are input to the AND gate 420.

The output signal from the AND gate 420 is input to the level shifter 430. The level shifter 430 converts the input signal into a signal having a voltage level corresponding to turning on or off the switching element.

The output signal from the level shifter 430 is input to the buffer 440. The buffer 440 buffers the input signal for the gate lines G1 to Gn such that the display panel assembly 300 is driven based on a predetermined driving method thereof.

The output signal from the buffer 440 is input to the gate lines G1 to Gn.

Referring to FIG. 3, a first clock control signal CPV1 and a second clock control signal CPV2 enter into a high level, e.g., have a rising edge, in a period when the first scanning start signal STV1 is in a high level. The timings of the first clock control signal CPV1 and the second clock control signal CPV2 may be independent of each other. In one exemplary embodiment, for example, the intervals and the sequences of rising edges of the first clock control signal CPV1 and the second clock control signal CPV2 may be controlled in the period when the first scanning start signal STV1 is in the high level.

The gate-on voltage Von of a (4n−3)-th gate line is synchronized with the first clock control signal CPV1, and the gate-on voltage Von of a (4n−1)-th gate line is synchronized with the second clock control signal CPV2 (n is a natural number). In one exemplary embodiment, for example, the gate-on voltage Von of the first gate line G1 is synchronized with a first pulse of the first clock control signal CPV1, and the gate-on voltage Von of the third gate line G3 is synchronized with a first pulse of the second clock control signal CPV2.

In an exemplary embodiment, a third clock control signal CPV3 and a fourth clock control signal CPV4 enter into a high level, e.g., have a rising edge, in a period when the second scanning start signal STV2 is in the high level. The timing of the second scanning start signal STV2 may be independent of the timing of the first scanning start signal STV1. The timings of the third clock control signal CPV3 and the fourth clock control signal CPV4 may be independent of each other. In one exemplary embodiment, for example, the intervals and the sequences of rising edges of the third clock control signal CPV3 and the fourth clock control signal CPV4 may be effectively controlled in the period when the second scanning start signal STV2 is in the high level.

The gate-on voltage Von of a (4n−2)-th gate line is synchronized with the third clock control signal CPV3 and the gate-on voltage Von of a 4n-th gate line is synchronized with the fourth clock control signal CPV4 (n is a natural number). In one exemplary embodiment, for example, the gate-on voltage Von of the second gate line G2 is synchronized with a third pulse of the third clock control signal CPV3, and the gate-on voltage Von of the fourth gate line G4 is synchronized with a third pulse of the fourth clock control signal CPV4.

Referring to FIG. 4, the gate-on voltages of two gate lines overlap each other, and the charging time of a display device having a high driving frequency such as 240 hertz (Hz) or 480 Hz is increased such that display quality of the display device is substantially improved. In an exemplary embodiment, unlike the signals shown in FIG. 3, the first pulse of the first clock control signal CPV1, generated in a period when the first scanning start signal STV1 is in a high level, overlaps the first pulse of the second clock control signal CPV2, as shown in FIG. 4, and the gate-on voltage Von of the (4n−3)-th gate line and the gate-on voltage Von of the (4n−1)-th gate line thereby overlap each other (n is a natural number). In such an embodiment, the third pulse of the third clock control signal CPV3, generated in the period when the second scanning start signal STV2 is in the high level, overlaps the third pulse of the fourth clock control signal CPV4 overlap, and the gate-on voltage Von of the (4n−2)-th gate line and the gate-on voltage Von of the 4n-th gate line thereby overlap each other (n is a natural number). In one exemplary embodiment, for example, the gate-on voltage Von of first gate line G1 and the gate-on voltage Von applied to the third gate line G3 overlap each other, the gate-on voltage Von applied to the third gate line G3 and the gate-on voltage Von applied to the fifth gate line G5 overlap each other, and the gate-on voltage Von applied to the fifth gate line G5 and the gate-on voltage Von applied to the seventh gate line G7 overlap each other. In such an embodiment, the gate-on voltage Von applied to the second gate line G2 and the gate-on voltage Von applied to the fourth gate line G4 overlap each other, the gate-on voltage Von applied to the fourth gate line G4 and the gate-on voltage Von applied to the sixth gate line G6 overlap each other, and the gate-on voltage Von applied to the sixth gate line G6 and the gate-on voltage Von applied to the eighth gate line G8 overlap each other.

Figure 5:
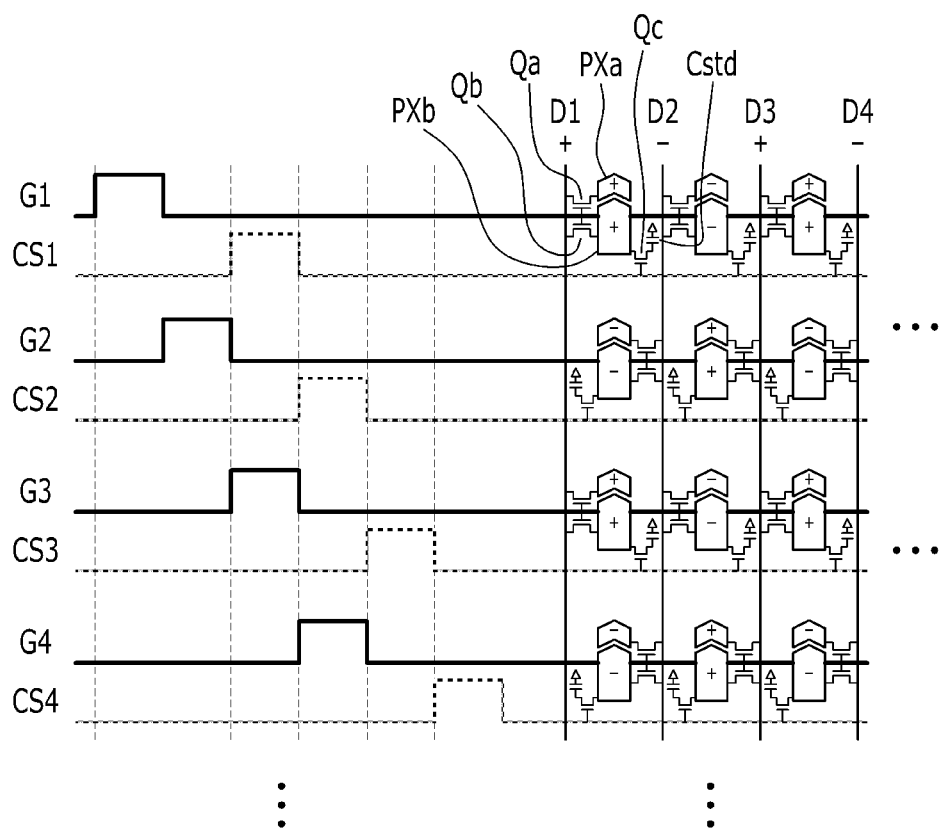
FIG. 5 is a signal timing diagram showing signals from a gate driver to an exemplary embodiment of a liquid crystal display according to the invention.

FIG. 5 is a signal timing diagram showing signals from a gate driver to an exemplary embodiment of a liquid crystal display according to the invention.

Referring to FIG. 5, the liquid crystal display includes signal lines including a plurality of gate lines G1 to Gn, a plurality of charge sharing lines CS1 to CSn, and a plurality of data lines D1 to Dm, and a plurality of pixels PX connected thereto. Each of the pixels PX includes a first subpixel electrode PXa and a second subpixel electrode PXb.

Each of the pixels PX includes the first switching element Qa, the second switching element Qb, the third switching element Qc and a transformation capacitor Cstd.

Each of the first switching element Qa, the second switching element Qb and the third switching element Qc is a three-terminal element such as a thin film transistor, for example. The first switching element Qa includes a control terminal connected to the gate lines G1 to Gn, an input terminal connected to the data lines D1 to Dm, and an output terminal connected to the first subpixel electrode PXa. The second switching element Qb includes a control terminal connected to the gate lines G1 to Gn, an input terminal connected to the data lines D1 to Dm, and an output terminal connected to the second subpixel electrode PXb. The control terminal of the first switching element Qa and the control terminal of the second switching element Qb are connected to a same gate line, and the input terminal of the first switching element Qa and the input terminal of the second switching element Qb are connected to a same data line. The third switching element Qc includes a control terminal connected to the charge sharing lines CS1 to CSn, an input terminal connected to the second subpixel electrode PXb, and an output terminal connected to the transformation capacitor Cstd.

Two terminals of the transformation capacitor Cstd are respectively connected to the output terminal of the third switching element Qc and the common voltage Vcom. Two terminals of the first liquid crystal capacitor are respectively connected to the first subpixel electrode PXa and the common voltage Vcom, and two terminals of the second liquid crystal capacitor are respectively connected to the second subpixel electrode PXb and the common voltage Vcom.

When the gate lines G1 to Gn are applied with the gate-on voltage Von, the first switching element Qa and the second switching element Qb connected to the gate lines G1 to Gn are turned on. Accordingly, a same data voltage Vd is applied to the first subpixel electrode PXa and the second subpixel electrode PXb through the turned-on first switching element Qa and second switching element Qb such that the voltage charged to the first liquid crystal capacitor and the voltage charged to the second liquid crystal capacitor are substantially the same as each other. When the gate lines G1 to Gn are applied with the gate-on voltage Von, the charge sharing lines CS1 to CSn are applied with the gate-off voltage Voff.

When the gate lines G1 to Gn are applied with the gate-off voltage Voff and the charge sharing lines CS1 to CSn are applied with the gate-on voltage Von, the first switching element Qa and the second switching element Qb connected to the gate lines G1 to Gn are turned off and the third switching element Qc is turned on. Accordingly, a portion of the charges charged to the second subpixel electrode Qb moves to the transformation capacitor Cstd through the turned-on second switching element Qb, and the voltage charged to the second liquid crystal capacitor decreases. In such an embodiment, the charging voltage of the first capacitor and the charging voltage of the second liquid crystal capacitor are different from each other, and lateral visibility of the liquid crystal display is thereby substantially improved.

The gate driver 400 of the liquid crystal display in FIG. 5 includes at least one IC chip in which several circuit elements are realized as shown in FIG. 2, and the size of the gate driver is substantially decreased due to the gate IC chip, compared with the case where the gate driver is integrated with the display panel assembly, such that the gate driver may be applied to a display device with a slim bezel having a small width. In one exemplary embodiment, for example, the width of the slim bezel of the display device including the gate IC chip may be less than about 10 mm, while a width of a bezel of the display device in which the gate driver is integrated with the display panel assembly is typically greater than about 10 mm.

Figure 6:
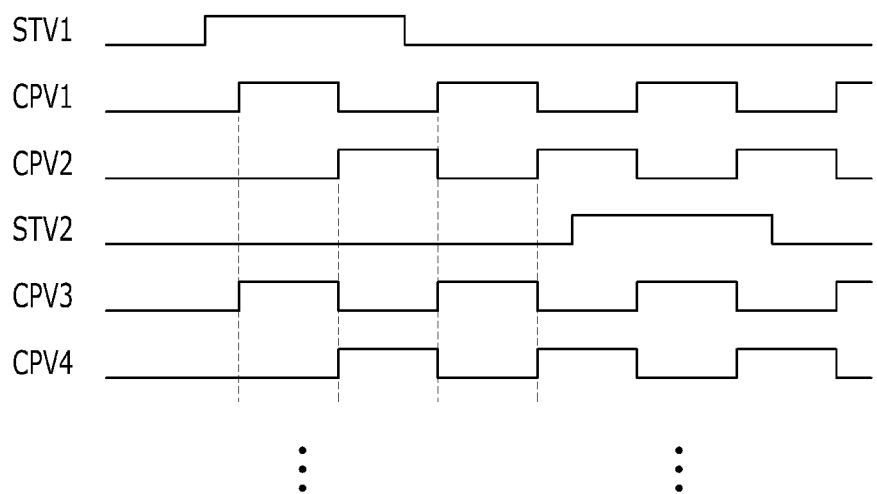
FIG. 6 is a signal timing diagram showing signals of an exemplary embodiment of a gate driver according to the invention.

FIG. 6 is a signal timing diagram showing signals of an exemplary embodiment of a gate driver according to the invention.

The signals shown in FIG. 6 may be applied to a liquid crystal display of FIG. 5 having a frame frequency such as 120 Hz or 240 Hz, or may also be applied to the gate driver of FIG. 2. Referring to FIG. 6, timings of rising edges of the first scanning start signal STV1 and the second scanning start signal STV2 are independent of each other, the timing of the gate-on voltage Von applied to the gate lines G1 to Gn and the timing of the gate-on voltage Von applied to the charge sharing lines CS1 to CSn may be effectively controlled based on a predetermined driving method. Here, the timing of the gate-on voltage Von applied to the charge sharing lines CS1 to CSn means discharging timing. In an exemplary embodiment, the timings of two clock control signals based on one scanning start signal may be independent, and the timings of the gate-on voltages Von may be effectively controlled to overlap each other such that display quality of the display device is substantially improved due to increased charging time. The first clock control signal CPV1 and the second clock control signal CPV2 are generated based on the first scanning start signal STV1, and the first clock control signal CPV1 and the second clock control signal CPV2 control the gate-on voltage Von independently applied to the gate lines G1 to Gn. The third clock control signal CPV3 and the fourth clock control signal CPV4 are generated based on the second scanning start signal STV2, and the third clock control signal CPV3 and the fourth clock control signal CPV4 control the gate-on voltage Von applied to the charge sharing lines CS1 to CSn.

Figure 7:
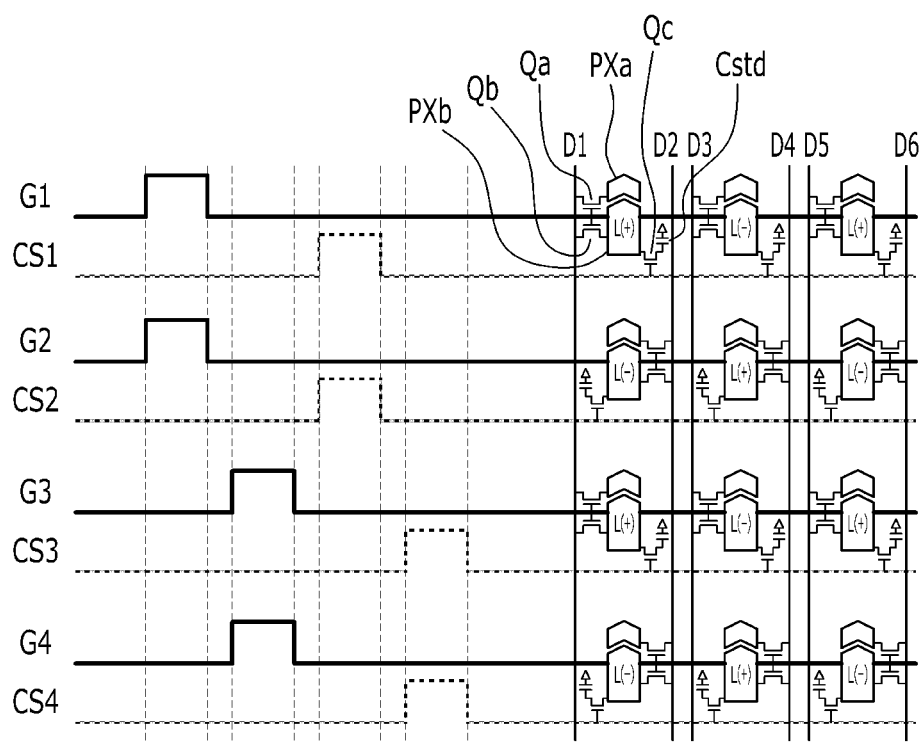
FIG. 7 is a signal timing diagram showing signals from a gate driver to an exemplary embodiment of a liquid crystal display according to the invention.

FIG. 7 is a signal timing diagram showing signals from a gate driver to an exemplary embodiment of a liquid crystal display according to the invention.

The liquid crystal display shown in FIG. 7 is substantially the same as the liquid crystal display shown in FIG. 5 except for the number of data lines therein. In one exemplary embodiment, for example, the connection relationships of the first subpixel electrode PXa, the second subpixel electrode PXb, the first switching element Qa, the second switching element Qb, the third switching element Qc, the transformation capacitor Cstd, the first liquid crystal capacitor and the second liquid crystal capacitor are substantially the same as the connection relationships of those in the circuit elements shown in FIG. 5. However, the numbers of data lines are different in the liquid crystal display shown in FIG. 7 and the liquid crystal display shown in FIG. 5, and accordingly the connection relationships of the adjacent pixel columns and the data lines are different. In one exemplary embodiment, for example, the number of data lines of the liquid crystal display shown in FIG. 7 is two times the number of data lines of the liquid crystal display shown in FIG. 5. In such an embodiment, the pixel PX positioned at the second row and the first column and the pixel PX positioned at the first row and the second column are connected to a same data line, e.g., the second data line D2, in FIG. 5, while the pixel PX positioned at the second row and the first column and the pixel PX positioned at the first row and the second column are connected to different data lines, e.g., the second data line D2 and the third data line D3, respectively, in FIG. 7.

Referring to FIG. 7, timings of the gate-on voltage Von applied to the (2n−1)-th gate line and the 2n-th gate line are substantially the same as each other, and the first switching element Qa and the second switching element Qb connected to the (2n−1)-th gate line and the first switching element Qa and the second switching element Qb connected to the 2n-th gate line are thereby simultaneously turned on (n is a natural number). Accordingly, the first data voltage and the second data voltage are simultaneously applied to the (2n−1)-th data line and the 2n-th data line, respectively, such that the time when the first data voltage is applied to the first subpixel electrode PXa and the second subpixel electrode PXb of the (2n−1)-th column through the first switching element Qa and the second switching element Qb connected to the (2n−1)-th gate line and the time when the second data voltage is applied to the first subpixel electrode PXa and the second subpixel electrode PXb of the 2n-th column through the first switching element Qa and the second switching element Qb connected to the 2n-th gate line are substantially the same as each other (n is a natural number). In such an embodiment, the first subpixel electrode PXa and the second subpixel electrode PXb are applied with the same data voltage such that the voltage charged to the first liquid crystal capacitor and the voltage charged to the second liquid crystal capacitor are substantially the same as each other. When the gate lines G1 to Gn are applied with the gate-on voltage Von, the charge sharing lines CS1 to CSn are applied with the gate-off voltage Voff.

When the gate lines G1 to Gn are applied with the gate-off voltage Voff and the charge sharing lines CS1 to CSn are applied with the gate-on voltage Von, the first switching element Qa and the second switching element Qb connected to the gate lines G1 to Gn are turned off and the third switching element Qc is turned on. Accordingly, a portion of the charge charged to the second subpixel electrode Qb moves into the transformation capacitor Cstd through the turned-on second switching element Qb such that the voltage charged to the second liquid crystal capacitor is decreased. In such an embodiment, the (2n−1)-th charge sharing line and the 2n-th charge sharing line are simultaneously applied with the gate-on voltage Von, and the voltage simultaneously charged to the (2n−1)-th column second capacitor and the 2n-th column second capacitor is decreased (n is a natural number). As described above, the charging voltage of the first capacitor and the charging voltage of the second liquid crystal capacitor are different from each other, and the lateral visibility of the liquid crystal display is thereby substantially improved.

The gate driver 400 applied to the liquid crystal display of FIG. 7 includes at least one IC chip in which several circuit elements are realized like FIG. 2, and this gate IC chip decreases the size of the gate driver compared with the case that the gate driver is integrated with the display panel assembly such that the gate driver may be applied to a display device having a slim bezel having a small width. In one exemplary embodiment, for example, the width of the slim bezel of the display device including the gate IC chip may be less than 10 mm, and the width of the bezel of the display device in which the gate driver is integrated with the display panel assembly may be difficult to be manufactured at less than 10 mm.

Figure 8:
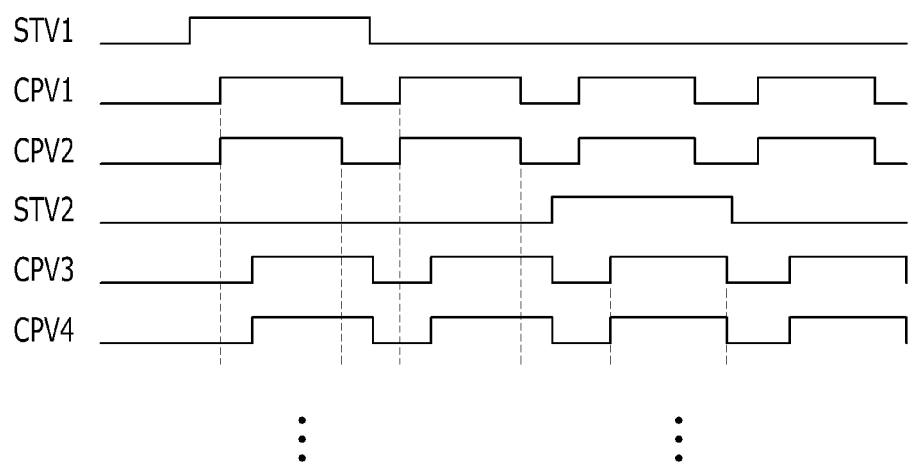
FIG. 8 is a signal timing diagram showing signals of an exemplary embodiment of a gate driver according to the invention.

FIG. 8 is a signal timing diagram showing signals of an exemplary embodiment of a gate driver according to the invention.

The signals shown in FIG. 8 may be applied to the liquid crystal display of FIG. 5 having a frame frequency such as 240 Hz or 480 Hz, or may also be applied to the gate driver of FIG. 2. Referring to FIG. 8, the timings of the first scanning start signal STV1 and the second scanning start signal STV2 are independent of each other, and the timing of the gate-on voltage Von applied to the gate lines G1 to Gn and the timing of the gate-on voltage Von applied to the charge sharing lines CS1 to CSn may be effectively controlled based on a predetermined driving method. Here, the timing of the gate-on voltage Von applied to the charge sharing lines CS1 to CSn means the discharging timing. The first clock control signal CPV1 and the second clock control signal CPV2 are simultaneously generated based on the first scanning start signal STV1, and the (2n−1)-th gate line and the 2n-th gate line are simultaneously applied with the gate-on voltage Von (n is a natural number). The third clock control signal CPV3 and the fourth clock control signal CPV4 are simultaneously generated based on the second scanning start signal STV2, and the (2n−1)-th charge sharing line and the 2n-th charge sharing line are simultaneously applied with the gate-on voltage Von (n is a natural number).

Figure 9:
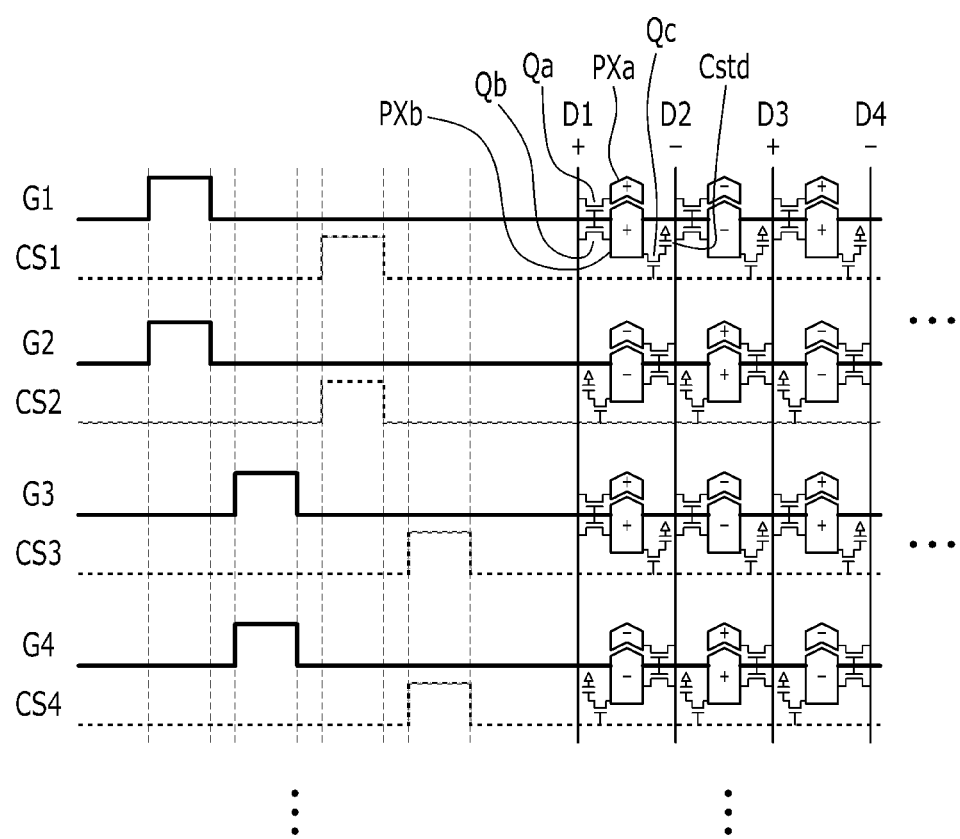
FIG. 9 is a signal timing diagram showing signals from a gate driver to an exemplary embodiment of a liquid crystal display according to the invention.

FIG. 9 is a signal timing diagram showing signals from a gate driver to an exemplary embodiment of a liquid crystal display according to the invention.

The liquid crystal display shown in FIG. 9 is substantially the same as the liquid crystal display shown in FIG. 5. In the exemplary embodiment in FIG. 9, for example, the connection relationships of the first subpixel electrode PXa, the second subpixel electrode PXb, the first switching element Qa, the second switching element Qb, the third switching element Qc, the transformation capacitor Cstd, the first liquid crystal capacitor, the second liquid crystal capacitor, the gate lines G1 to Gn, the data lines D1 to Dm, and the charge sharing lines CS1 to CS2 are the same as the connection relationships of those shown in FIG. 5. However, the signals from the gate driver shown in FIG. 9 is substantially the same as the signals from the gate driver shown in FIG. 7 such that the signals shown in FIG. 8 may be applied to the liquid crystal display of FIG. 9. In one exemplary embodiment, for example, a (2n−1)-th gate line and a 2n-th gate line are simultaneously applied with the gate-on voltage Von such that the data voltage applied to (2n−1)-th subpixel electrodes PXa and PXb and the data voltage applied to 2n-th subpixel electrodes PXa and PXb are the same as each other. The exemplary embodiment of the liquid crystal display shown in FIG. 9 may include the gate driver of FIG. 2. The signals of the liquid crystal display from the gate driver shown in FIG. 9 may be applied for driving the 3D image. In one exemplary embodiment, for example, when the liquid crystal display of FIG. 9 includes the gate driver of FIG. 2 and outputs a 2D image or a 3D image having a frame frequency of 120 Hz, the signals from the gate driver shown in FIG. 9 is applied for the output of the 3D image, and the signals from the gate driver shown in FIG. 5 is applied for the output of the normal 2D image. Accordingly, the driving of the 2D image and the driving of the 3D image may be effectively changed by controlling the timing of the scanning start signal and the clock control signal input to the gate driver of FIG. 2 and by controlling the width of the pulse.

Figure 10:
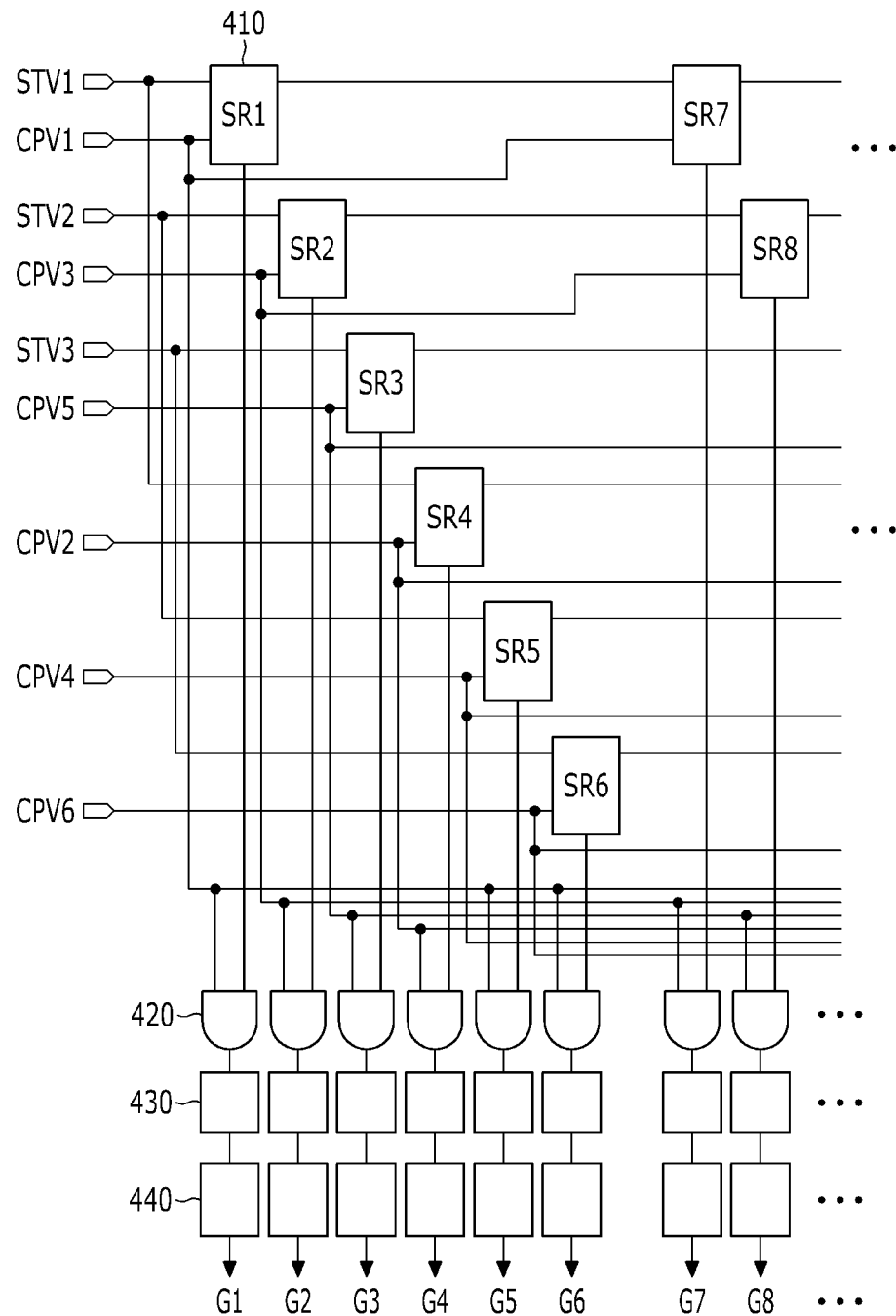
FIG. 10 is a block diagram showing an alternative exemplary embodiment of a gate driver according to the invention.
Figure 11:
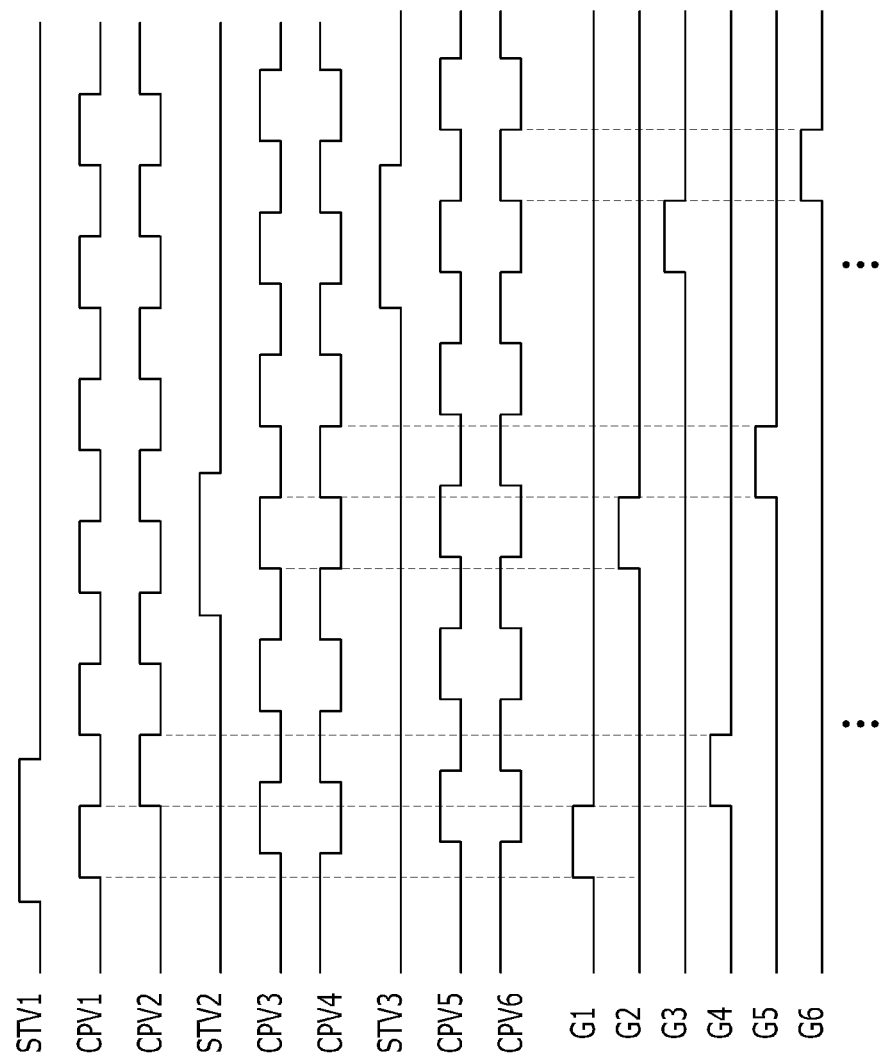
FIG. 11 is a signal timing diagram showing signals of an exemplary embodiment of a gate driver according to the invention.

FIG. 10 is a block diagram showing an exemplary embodiment of a gate driver according to the invention, and FIG. 11 is a signal timing diagram showing signals of an exemplary embodiment of a gate driver according to of the invention.

The elements of the gate driver shown in FIG. 10, e.g., the shift register 410 of the gate driver of FIG. 10, the AND gate 420, the level shifter 430 and the buffer 440, are substantially the same as the elements of the gate driver of FIG. 2, except the connection relationship of the gate driver of FIG. 10, which is different from the connection relationship of the elements of the gate driver of FIG. 2.

Referring to FIG. 10, a plurality of shift registers 410 in the gate driver are independently driven based on three scanning start signals, and two clock control signals are independently generated based on each scanning start signal. In one exemplary embodiment, for example, a (3n−1)-th shift registers SR1 and SR4 are driven based on a first scanning start signal STV1, a (3n−1)-th shift registers SR2 and SR5 are driven based on a second scanning start signal STV2, and a 3n-th shift registers SR3 and SR6 are driven based on a third scanning start signal STV3 (n is a natural number). The timing of three scanning start signals may be independent of each other, the timing of the gate-on voltage Von may be effectively controlled based on a predetermined driving method. In such an embodiment, the timing of two clock control signals based on each scanning start signal may be independent of each other such that the timing of the gate-on voltage Von may be effectively controlled to overlap each other, and display quality of the display device is substantially improved due to increased charging time. In an exemplary embodiment, the number of clock control signals independently generated based on scanning start signal may be three or more.

Referring to FIG. 11, in the period when the first scanning start signal STV1 is in a high level, the first clock control signal CPV1 and the second clock control signal CPV2 enter into a high level, e.g., have a rising edge. The timings of the first clock control signal CPV1 and the second clock control signal CPV2 are independent of each other. In one exemplary embodiment, for example, the intervals and the sequences of rising edges of the first clock control signal CPV1 and the second clock control signal CPV2 may be effectively controlled in the period when the first scanning start signal STV1 is in the high level.

The gate-on voltage Von of a (6n−5)-th gate line is synchronized with the first clock control signal CPV1, and the gate-on voltage Von of a (6n−4)-th gate line is synchronized with the second clock control signal CPV2 (n is a natural number).

In an exemplary embodiment, the third clock control signal CPV3 and the fourth clock control signal CPV4 enter into a high level in the period when the second scanning start signal STV2 is in a high level. The timings of the third clock control signal CPV3 and the fourth clock control signal CPV4 may be independent of each other. In one exemplary embodiment, for example, the intervals and the sequences of rising edges of the third clock control signal CPV3 and the fourth clock control signal CPV4 may be effectively controlled in the period when the second scanning start signal STV2 is in the high level.

The gate-on voltage Von of a (6n−3)-th gate line is synchronized with the third clock control signal CPV3, and the gate-on voltage Von of a (6n−2)-th gate line is synchronized with the fourth clock control signal CPV4 (n is a natural number).

In an exemplary embodiment, a fifth clock control signal CPV5 and a sixth clock control signal CPV6 enter into a high level in a period when a third scanning start signal STV3 is the high level. The timings of the fifth clock control signal CPV5 and the sixth clock control signal CPV6 may be independent of each other. In one exemplary embodiment, for example, the intervals and the sequences of rising edges of the fifth clock control signal CPV5 and the sixth clock control signal CPV6 may be effectively controlled in the period when the third scanning start signal STV3 is in the high level.

The gate-on voltage Von of the (6n−1)-th gate line is synchronized with the fifth clock control signal CPV5, and the gate-on voltage Von of the 6n-th gate line is synchronized with the sixth clock control signal CPV6 (n is a natural number).

Figure 12:
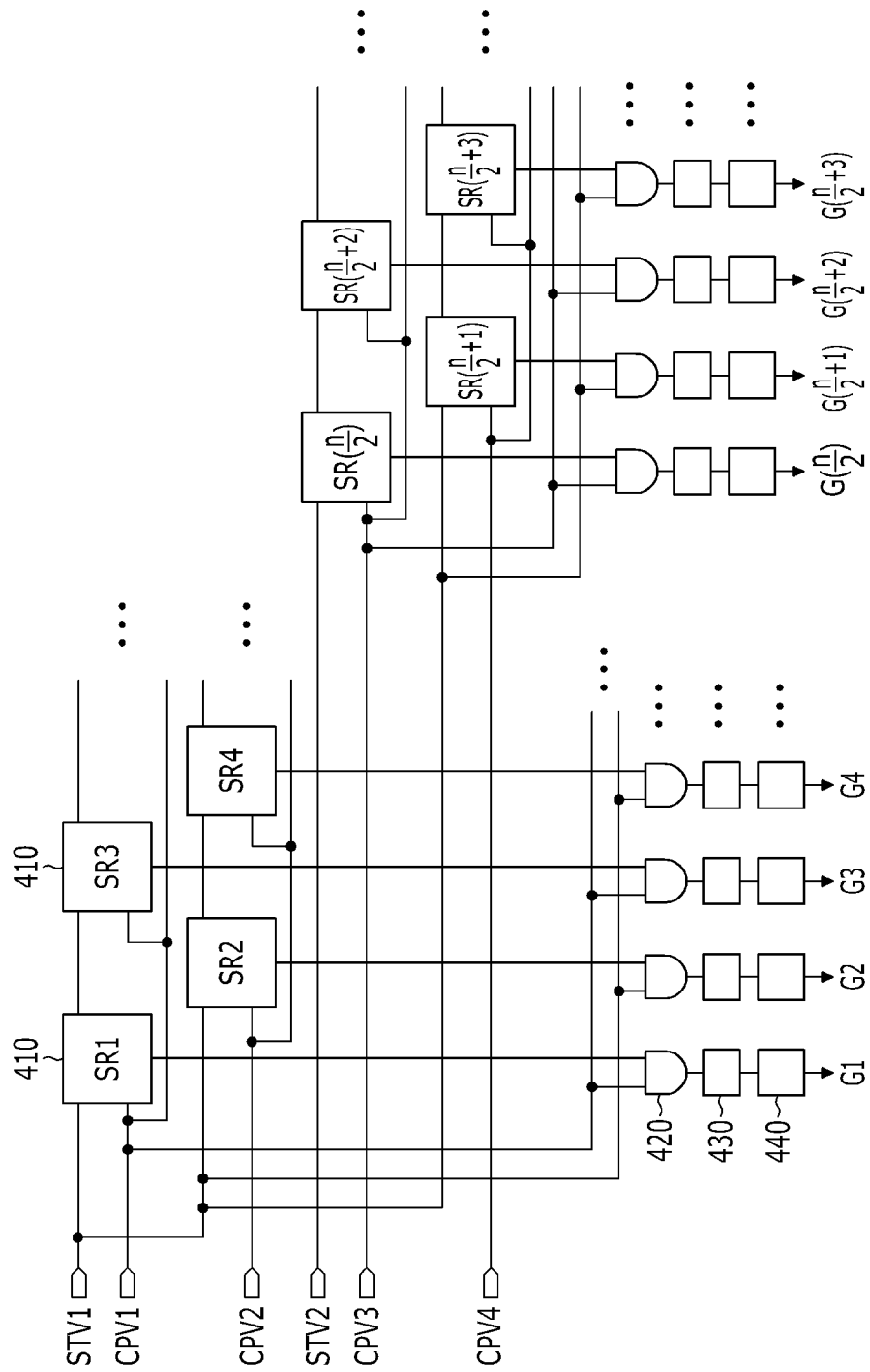
FIG. 12 is a block diagram showing another alternative exemplary embodiment of a gate driver according to the invention.
Figure 13:
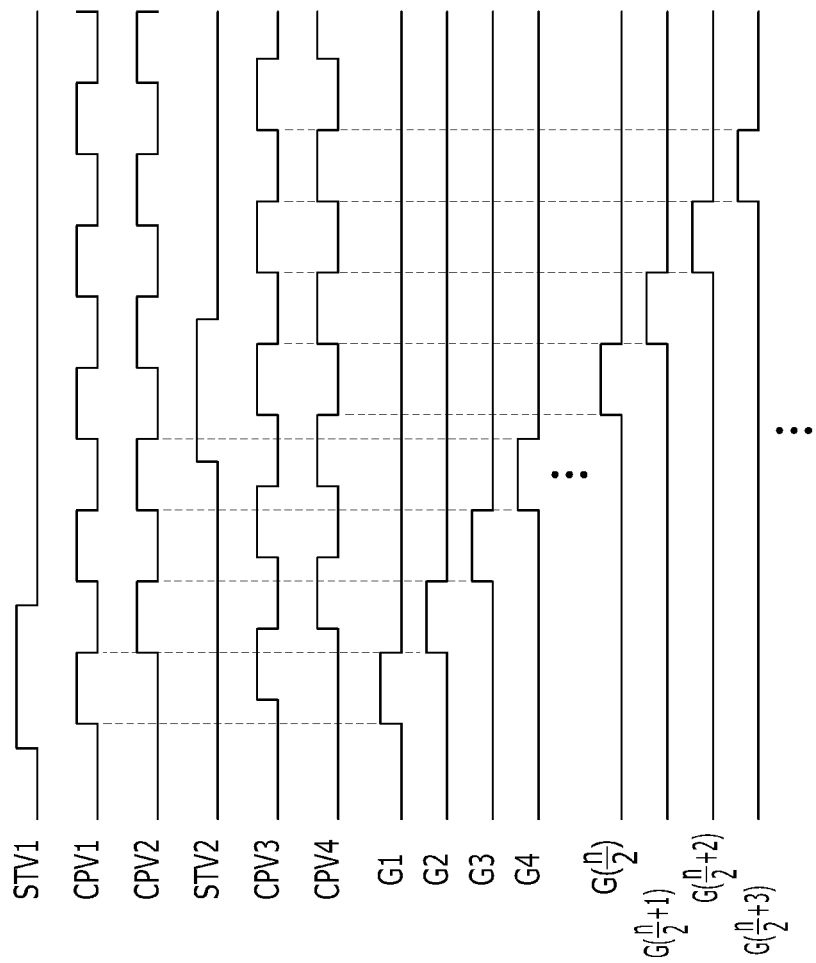
FIG. 13 is a signal timing diagram showing signals of an exemplary embodiment of a gate driver according to the invention.

FIG. 12 is a block diagram showing an exemplary embodiment of a gate driver according to an the invention, and FIG. 13 is a signal timing diagram showing signals of an exemplary embodiment of a gate driver according to the invention.

The elements of the gate driver shown in FIG. 12, e.g., the shift register 410, the AND gate 420, the level shifter 430 and the buffer 440, are substantially the same as the elements of the gate driver of FIG. 2, except the connection relationship of the gate driver that is different from the gate driver of FIG. 2.

Referring to FIG. 12, a plurality of shift registers 410 in the gate driver are independently driven based on two scanning start signals, and two clock control signals are independently generated based on each scanning start signal. However, four shift registers 410 of the gate driver in FIG. 12 are driven based on each scanning start signal, e.g., a first shift register SR1 to an (n/2-1)-th shift register SR(n/2−1) are driven based on the first scanning start signal STV1, and an n/2-th shift register SR(n/2) to an (n)-th shift register SRn are driven based on the second scanning start signal STV2 (n is an even number). In an exemplary embodiment, a plurality of shift registers 410 are independently driven based on three or more scanning start signals, and in such an embodiment, the shift register is divided into three or more shift register groups and may be independently driven.

The timing of two scanning start signals may be independent of each other, and the timings of the gate-on voltages Von are thereby effectively controlled based on a predetermined driving method. In such an embodiment, the timings of two clock control signals based on one scanning start signal may be independent of each other, and the timings of the gate-on voltages Von may be effectively controlled to overlap each other such that display quality of the display device is substantially improved due to increased charging time.

Referring to FIG. 13, in the period when the first scanning start signal STV1 is a high level, the first clock control signal CPV1 and the second clock control signal CPV2 enter into a high level. The timing of the first clock control signal CPV1 and the second clock control signal CPV2 may be independent of each other. In one exemplary embodiment, for example, the interval and the sequence of the rising edges of the first clock control signal CPV1 and the second clock control signal CPV2 may be effectively controlled in the period when the first scanning start signal STV1 is in the high level.

The gate-on voltage Von of an odd-numbered gate lines among the gate lines, e.g., the first gate line G1 to an (n/2-1)-th gate line G(n/2−1), is synchronized with the first clock control signal CPV1, and the gate-on voltage Von of an even-numbered gate lines is synchronized with the second clock control signal CPV2 (n is an even number).

In an exemplary embodiment, the third clock control signal CPV3 and the fourth clock control signal CPV4 enter into a high level in the period when the second scanning start signal STV2 is in a high level. The timing of the third clock control signal CPV3 and the fourth clock control signal CPV4 may be independent. In one exemplary embodiment, for example, the interval and the sequence of the rising timing of the third clock control signal CPV3 and the rising timing of the fourth clock control signal CPV4 may be appropriately controlled in the period when the second scanning start signal STV2 is the high level.

The gate-on voltage Von of the odd-numbered gate line among the gate lines from an n/2-th gate line G(n/2) to an n-th gate line Gn is synchronized with the first clock control signal CPV1, and the gate-on voltage Von of the even-numbered gate line is synchronized with the second clock control signal CPV2 (n is an even number).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
a first pixel and a second pixel adjacent to each other in a column direction; and
a gate integrated circuit chip which receives at least two scanning start signals and at least four clock control signals, and outputs a plurality of gate-on voltages,
wherein the first pixel comprises:
a first switching element connected to a first gate line and a first data line;
a second switching element connected to the first gate line and the first data line;
a first subpixel electrode connected to the first switching element;
a second subpixel electrode connected to the second switching element;
a third switching element connected to the second subpixel electrode and a first charge sharing line; and
a first capacitor connected to the third switching element,
wherein the second pixel comprises:
a fourth switching element connected to a second gate line and a second data line;
a fifth switching element connected to the second gate line and the second data line;
a third subpixel electrode connected to the fourth switching element;
a fourth subpixel electrode connected to the fifth switching element;
a sixth switching element connected to the fourth subpixel electrode and a second charge sharing line; and
a second capacitor connected to the sixth switching element,
wherein at least two clock control signals of the at least four clock control signals are generated based on one scanning start signal of the at least two scanning start signals,
wherein timings of the at least two scanning start signals are independent of each other,
wherein timings of the at least two clock control signals based on the one scanning start signal are independent of each other, and
the first gate line and the second gate line are applied with the gate-on voltage simultaneously.

2. The liquid crystal display of claim 1, wherein
a first gate-on voltage of the plurality of gate-on voltages is applied to the first gate line and synchronized with a first clock control signal of the at least two clock control signals based on the one scanning start signal, and
a second gate-on voltage of the plurality of gate-on voltages is applied to the first charge sharing line and synchronized with a second clock control signal of the at least two clock control signals based on the one scanning start signal.

3. The liquid crystal display of claim 2, wherein
a rising edge of the first clock control signal is generated in a period when a first scanning start signal of the at least two scanning start signals is in a high level, and
a rising edge of the second clock control signal is generated in a period when a second scanning start signal of the at least two scanning start signals is in a high level.

4. The liquid crystal display of claim 2, wherein
a third gate-on voltage of the plurality of gate-on voltages is applied to the second gate line adjacent to the first gate line,
a timing of rising edge of the third gate-on voltage is the same as a timing of rising edge of the first gate-on voltage,
a fourth gate-on voltage of the plurality of gate-on voltages is applied to the second charge sharing line adjacent to the first charge sharing line, and
a timing of rising edge of the fourth gate-on voltage is the same as a timing of rising edge of the second gate-on voltage.

5. The liquid crystal display of claim 2, wherein
the first and second subpixel electrodes are disposed outside of an area between the second data line adjacent to the first data line and a third data line adjacent to the second data line.

6. The liquid crystal display of claim 5, wherein
a third gate-on voltage of the plurality of gate-on voltages is applied to the second gate line adjacent to the first gate line,
the third gate-on voltage and the first gate-on voltage are simultaneously applied,
a fourth gate-on voltage of the plurality of gate-on voltages is applied to a second charge sharing line adjacent to the first charge sharing line, and
the fourth gate-on voltage and the second gate-on voltage are simultaneously applied.

7. The liquid crystal display of claim 1, wherein
a first gate-on voltage of the plurality of gate-on voltages is applied to the first gate line,
a second gate-on voltage of the plurality of gate-on voltages is applied to the second gate line adjacent to the first gate line, and
the first gate-on voltage and the second gate-on voltage overlap each other.

8. The liquid crystal display of claim 1, further comprising a bezel having a width less than about 10 millimeters.

9. The liquid crystal display of claim 1, wherein
the liquid crystal display outputs a three-dimensional image comprising a left eye image and a right eye image.

10. The liquid crystal display of claim 9, wherein
a first gate-on voltage of the plurality of gate-on voltages is applied to the first gate line and synchronized with a first clock control signal of the at least two clock control signals based on the one scanning start signal, and
a second gate-on voltage of the plurality of gate-on voltages is applied to the first charge sharing line and synchronized with a second clock control signal of the at least two clock control signals based on the one scanning start signal.

11. The liquid crystal display of claim 10, wherein
a third gate-on voltage of the plurality of gate-on voltages is applied to the second gate line adjacent to the first gate line,
the third gate-on voltage and the first gate-on voltage are simultaneously applied,
a fourth gate-on voltage of the plurality of gate-on voltages is applied to a second charge sharing line adjacent to the first charge sharing line, and
the fourth gate-on voltage and the second gate-on voltage are simultaneously applied.

12. A liquid crystal display comprising:
a first pixel and a second pixel adjacent to each other in a column direction; and
a gate integrated circuit chip which receives at least two scanning start signals and at least four clock control signals, and outputs a plurality of gate-on voltages,
wherein the first pixel comprises:
a first switching element connected to a first gate line and a first data line;
a second switching element connected to the first gate line and the first data line;
a first subpixel electrode connected to the first switching element;
a second subpixel electrode connected to the second switching element;
a third switching element connected to the second subpixel electrode and a first charge sharing line; and
a first capacitor connected to the third switching element,
wherein the second pixel comprises:
a fourth switching element connected to a second gate line and a second data line;
a fifth switching element connected to the second gate line and the second data line;
a third subpixel electrode connected to the fourth switching element;
a fourth subpixel electrode connected to the fifth switching element;
a sixth switching element connected to the fourth subpixel electrode and a second charge sharing line; and
a second capacitor connected to the sixth switching element,
wherein at least two clock control signals of the at least four clock control signals are generated based on one scanning start signal of the at least two scanning start signals,
wherein timings of the at least two scanning start signals are independent of each other,
wherein timings of the at least two clock control signals based on the one scanning start signal are independent of each other,
wherein a first gate-on voltage of the plurality of gate-on voltages is applied to the first gate line and synchronized with a first clock control signal of the at least two clock control signals based on the one scanning start signal,
wherein a second gate-on voltage of the plurality of gate-on voltages is applied to the first charge sharing line and synchronized with a second clock control signal of the at least two clock control signals based on the one scanning start signal, and
wherein
a third gate-on voltage of the plurality of gate-on voltages is applied to the second gate line adjacent to the first gate line,
a timing of rising edge of the third gate-on voltage is different from a timing of rising edge of the first gate-on voltage,
a fourth gate-on voltage of the plurality of gate-on voltages is applied to the second charge sharing line adjacent to the first charge sharing line, and
a timing of rising edge of the fourth gate-on voltage is different from a timing of rising edge of the second gate-on voltage.

* * * * *